United States Patent
Saiki et al.

(10) Patent No.: US 8,669,583 B2
(45) Date of Patent: Mar. 11, 2014

(54) HEAT-CURABLE SILICONE RESIN COMPOSITION FOR SEALING OPTICAL SEMICONDUCTORS, AND A SEALED OPTICAL SEMICONDUCTOR USING THE SAME

(75) Inventors: Takeaki Saiki, Hiratsuka (JP); Yoshihito Takei, Hiratsuka (JP)

(73) Assignee: The Yokohama Rubber Co., Ltd. (JP)

( * ) Notice: Subject to any disclaimer, the term of this patent is extended or adjusted under 35 U.S.C. 154(b) by 0 days.

(21) Appl. No.: 13/402,322

(22) Filed: Feb. 22, 2012

(65) Prior Publication Data
US 2012/0211797 A1 Aug. 23, 2012

(30) Foreign Application Priority Data
Feb. 22, 2011 (JP) .................. 2011-036175

(51) Int. Cl.
- H01L 33/52 (2010.01)
- C08G 77/08 (2006.01)
- C08G 77/04 (2006.01)

(52) U.S. Cl.
USPC ........ 257/100; 257/E33.059; 528/17; 528/19; 528/33

(58) Field of Classification Search
None
See application file for complete search history.

(56) References Cited

U.S. PATENT DOCUMENTS

| 4,100,129 | A | 7/1978 | Beers | |
|---|---|---|---|---|
| 4,895,766 | A * | 1/1990 | Saad | 428/447 |
| 7,504,468 | B2 * | 3/2009 | Guennouni et al. | 528/17 |
| 8,222,352 | B2 * | 7/2012 | Hirano | 525/477 |
| 2006/0079620 | A1 * | 4/2006 | Greene et al. | 524/430 |
| 2009/0304961 | A1 * | 12/2009 | Taguchi et al. | 428/35.7 |
| 2011/0054072 | A1 * | 3/2011 | Sawada et al. | 523/353 |
| 2011/0248314 | A1 * | 10/2011 | Takei et al. | 257/100 |

FOREIGN PATENT DOCUMENTS

| JP | 10-228249 | 8/1998 | |
|---|---|---|---|
| JP | 2001-200161 | 7/2001 | |
| JP | 2006-206700 | 8/2006 | |
| JP | 2007-224089 | 9/2007 | |
| WO | WO 2010071092 A1 * | 6/2010 | H01L 23/29 |

OTHER PUBLICATIONS

Technical data sheet for SILRES MK, 2 pages, 2012.*

* cited by examiner

*Primary Examiner* — Robert S Loewe

(74) *Attorney, Agent, or Firm* — Thorpe North & Western LLP

(57) ABSTRACT

A heat-curable silicone resin composition for sealing optical semiconductors including: component (A): 100 parts by mass of a silicon compound expressed by Formula (1) below; and component (B): from 0.001 to 10 parts by mass of a condensation catalyst.

$$(R^1SiO_{3/2})_a((R^2)_2SiO_{2/2})_b((R^3)_3SiO_{1/2})_c(SiO_{4/2})_d(XO_{1/2})_e \qquad (1)$$

In this formula, $R^1$, $R^2$, and $R^3$ are identical or differing monovalent organic groups, "X" is a hydrogen atom or a monovalent organic group, "a" is a positive number, "b" is 0 or a positive number, "c" is 0 or a positive number, "d" is 0 or a positive number, and "e" is 0 or a positive number; however "a" to "e" satisfy the following conditions: b/a is a number from 0 to 10, c/a is a number from 0 to 0.5, d/(a+b+c+d) is a number from 0 to 0.3, and e/(a+b+c+d) is a number from 0.01 to 1.5.

18 Claims, 4 Drawing Sheets

HEAT-CURABLE SILICONE RESIN COMPOSITION FOR SEALING OPTICAL SEMICONDUCTORS, AND A SEALED OPTICAL SEMICONDUCTOR USING THE SAME

PRIORITY CLAIM

Priority is claimed to Japan Patent Application Serial No. 2011-36175 filed on Feb. 22, 2011.

BACKGROUND

1. Technical Field

The present technology relates to a heat-curable silicone resin composition for sealing optical semiconductors, and a sealed optical semiconductor using the same.

2. Related Art

Conventionally, epoxy resins have been proposed as resins for use in compositions for sealing optical semiconductors (e.g. Japanese Unexamined Patent Application Publication No. H10-228249A). However, there is a problem in that a color of seals formed from compositions including epoxy resin yellows due to heat emitted from white LED elements.

Additionally, organopolysiloxane compositions that cure at room temperature including an organopolysiloxane containing two silanol groups, a silane compound containing two or more hydrolyzable groups in the molecule that are bonded to a silicon atom, and an organic zirconium compound have been proposed (e.g. Japanese Unexamined Patent Application Publication No. 2001-200161A and Japanese Unexamined Patent Application Publication No. H02-196860A).

Moreover, mixing a condensation catalyst with a diorganopolysiloxane containing two silanol groups and a silane containing three or more alkoxy groups, and then heating the mixture has been proposed (e.g. Japanese Unexamined Patent Application Publication No. 2007-224089 and Japanese Unexamined Patent Application Publication No. 2006-206700).

However, gas permeability is higher when using a silicone resin compared to an epoxy resin and, thus, silver plating of optical semiconductor packages easily discolors over time due to the hydrogen sulfide in the air, which results in a tendency for brightness to decline.

SUMMARY

The present inventors discovered that by using a composition including a component (A) and a component (B) described below, a cured product having gas barrier properties and in which an increase in hardness of the resin is suppressed can be obtained. The present inventors also discovered that, for example, such a composition displays barrier properties (sulfur resistance) with respect to hydrogen sulfide and that discoloration of silver is suppressed. Thus, the present inventors arrived at the present technology. In other words, the present technology provides a heat-curable silicone resin composition for sealing optical semiconductors having gas barrier properties (e.g. sulfur resistance), and a sealed optical semiconductor using the same.

Specifically, the present technology provides the following 1 to 10.

1. A heat-curable silicone resin composition for sealing optical semiconductors including: Component (A): 100 parts by mass of a silicon compound expressed by Formula (1) below;

$$(R^1SiO_{3/2})_a((R^2)_2SiO_{2/2})_b((R^3)_3SiO_{1/2})_c(SiO_{4/2})_d (XO_{1/2})_e \quad (1)$$

In this formula, $R^1$, $R^2$, and $R^3$ are identical or differing monovalent organic groups, "X" is a hydrogen atom or a monovalent organic group, "a" is a positive number, "b" is 0 or a positive number, "c" is 0 or a positive number, "d" is 0 or a positive number, and "e" is 0 or a positive number; however "a" to "e" satisfy the following conditions: b/a is a number from 0 to 10, c/a is a number from 0 to 0.5, d/(a+b+c+d) is a number from 0 to 0.3, and e/(a+b+c+d) is a number from 0.01 to 1.5; and Component (B): from 0.001 to 10 parts by mass of a condensation catalyst.

2. The heat-curable silicone resin composition for sealing optical semiconductors described in 1, that can include one type or two or more types of the component (A); wherein the component (A) can be a silicon compound A1 having a melting point or softening point that is greater than 25° C. and/or a silicon compound A2 having a melting point or softening point that is not greater than 25° C.

3. The heat-curable silicone resin composition for sealing optical semiconductors described in 2, wherein the silicon compound A1 can have a silsesquioxane skeleton.

4. The heat-curable silicone resin composition for sealing optical semiconductors described in 2 or 3, wherein the silicon compound A2 can be at least one selected from the group consisting of: a partially hydrolytic condensate of a hydrolytic condensable silane compound expressed by Formula (2) below, having not more than 30 mass % of hydrolyzable groups;

a silicone alkoxy oligomer; and a compound having an alkoxysilyl group on at least one end and not less than three alkoxy groups in the molecule.

$$(R^4)_m(OR^5)_nSiO_{(4-m-n)/2} \quad (2)$$

In this formula, $R^4$ are identical or differing alkyl groups, alkenyl groups, or aryl groups having from 1 to 6 carbons; $R^5$ are identical or differing hydrogen atoms, or alkyl groups, alkenyl groups, alkoxyalkyl groups, or acyl groups having from 1 to 6 carbons; "m" is a number satisfying $0.5 \leq m < 2$ (2.0); and "n" is a number satisfying $0 < n < 2$. However, $1 < m+n \leq 3$.

5. The heat-curable silicone resin composition for sealing optical semiconductors described in any of 2 to 4, wherein the silicon compound A2 can be a partially hydrolytic condensate of a methyltrimethoxysilane or a partially hydrolytic condensate of a mixture of a methyltrimethoxysilane and a dimethyldimethoxysilane.

6. The heat-curable silicone resin composition for sealing optical semiconductors described in any of 1 to 5, that can include one type or two or more types of the component (B); wherein at least one type of the component (B) is a zirconium compound and/or a zinc compound.

7. The heat-curable silicone resin composition for sealing optical semiconductors described in any of 1 to 5, that can include two or more types of the component (B); wherein the component (B) can include both a transition metal compound and a base metal compound.

8. The heat-curable silicone resin composition for sealing optical semiconductors described in any one of 1 to 7, further including from 1 to 1,000 parts by mass of a component (C), which is a compound expressed by Formula (3) below, having a molecular weight not greater than 50,000 and/or a compound expressed by Formula (4) below, having a molecular weight not greater than 5,000, per 100 parts by mass of the component (A).

$$HO(R^6_2SiO)_m(R^6R^7SiO)_nH \quad (3)$$

In this formula, $R^6$ is a monovalent hydrocarbon group having from 1 to 20 carbons, $R^7$ is a monovalent hydrocarbon group having from 2 to 20 carbons that is different from $R^6$, "m" is an integer greater than or equal to 0, and "n" is an integer greater than or equal to 3.

$$XO((R^6)_2SiO)_nX \quad (4)$$

In this formula, $R^6$ are identical or differing groups defined in Formula (3) above, "n" is an integer greater than or equal to 3, and "X" is a hydrogen atom or a monovalent hydrocarbon group having from 1 to 6 carbons.

9. The heat-curable silicone resin composition for sealing optical semiconductors described in 8, wherein in the Formula (3), a group represented by $R^7$ can be a monovalent hydrocarbon group having a ring structure.

10. A sealed optical semiconductor obtainable by sealing an LED chip by: applying a heat-curable silicone resin composition for sealing optical semiconductors described in any of 1 to 9 to the LED chip, heating the LED chip, and curing the heat-curable silicone resin composition for sealing optical semiconductors.

The heat-curable silicone resin composition for sealing optical semiconductors of the present technology includes the component (A) and the component (B) described below and, thus, said composition can be used to manufacture a resin cured product with superior gas barrier properties. Thus, the resin cured product obtained using the heat-curable silicone resin composition for sealing optical semiconductors of the present technology has, for example, higher barrier properties (sulfur resistance) against hydrogen sulfide.

The sealed optical semiconductor of the present technology has superior gas barrier properties (e.g. sulfur resistance).

DETAILED DESCRIPTION

Figure 1:
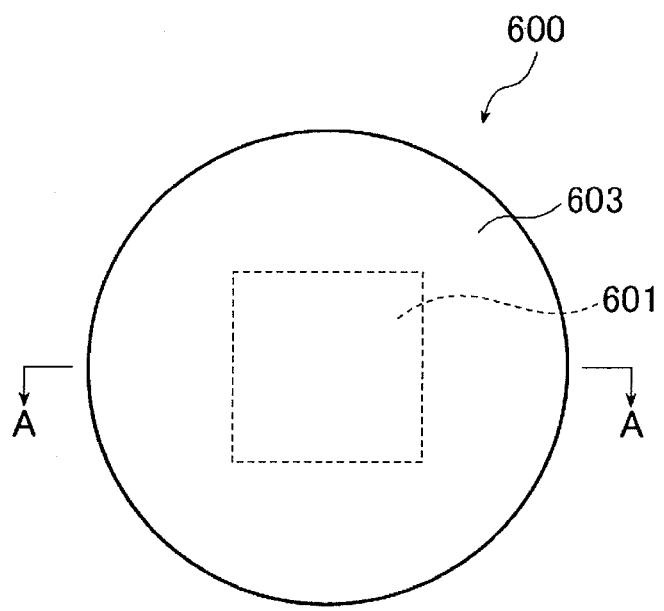
FIG. 1 is a top view schematically illustrating an example of a sealed optical semiconductor of the present technology.

Hereinafter, a heat-curable silicone resin composition for sealing optical semiconductors and a sealed optical semiconductor using the same of the present technology will be described in detail.

1. Heat-Curable Silicone Resin Composition for Sealing Optical Semiconductors

A heat-curable silicone resin composition for sealing optical semiconductors of the present technology includes:

Component (A): 100 parts by mass of a silicon compound expressed by Formula (1) below $$(R^1SiO_{3/2})_a((R^2)_2SiO_{2/2})_b((R^3)_3SiO_{1/2})_c(SiO_{4/2})_d(XO_{1/2})_e \quad (1)$$

In this formula, $R^1$, $R^2$, and $R^3$ are identical or differing monovalent organic groups, "X" is a hydrogen atom or a monovalent organic group, "a" is a positive number, "b" is 0 or a positive number, "c" is 0 or a positive number, "d" is 0 or a positive number, and "e" is 0 or a positive number; however "a" to "e" satisfy the following conditions: b/a is a number from 0 to 10, c/a is a number from 0 to 0.5, d/(a+b+c+d) is a number from 0 to 0.3, and e/(a+b+c+d) is a number from 0.01 to 1.5; and Component (B): from 0.001 to 10 parts by mass of a condensation catalyst.

Note that the heat-curable silicone resin composition for sealing optical semiconductors of the present technology is also referred to herein as the "composition according to the present technology".

1.1. Component (A)

The component (A) is a silicon compound expressed by Formula (1) above. In Formula (1), examples of the monovalent organic groups represented by $R^1$, $R^2$, and $R^3$ include monovalent hydrocarbon groups such as alkyl groups having from 1 to 6 carbon groups (e.g. methyl groups, ethyl groups, propyl groups, isopropyl groups, n-butyl groups, isobutyl groups, and tert-butyl groups); alkenyl groups having from 1 to 6 carbons (e.g. vinyl groups, allyl groups, 1-propenyl groups, isopropenyl groups, 2-butenyl groups, 1,3-butadienyl groups, 2-pentenyl groups, and 2-hexenyl groups); aryl groups having from 1 to 12 carbons (e.g. phenyl groups and naphthyl groups); and the like.

Additionally, in Formula (1), examples of the monovalent organic group represented by "X" include alkyl groups having from 1 to 6 carbons, alkenyl groups having from 1 to 6 carbons, alkoxyalkyl groups having from 1 to 6 carbons, and acyl groups having from 1 to 6 carbons. The backbone of the component (A) may be straight or branched.

The composition of the present technology can include one type or two or more types of the component (A). For example, the component (A) can be a silicon compound A1 having a melting point or softening point that is greater than 25° C. and/or a silicon compound A2 having a melting point or softening point that is not greater than 25° C. That is, the composition of the present technology can include only the silicon compound A1 or only the silicon compound A2, or can include both the silicon compound A1 and the silicon compound A2.

When composition of the present technology includes both the silicon compound A1 and the silicon compound A2, the composition of the present technology can include from 0 to 500 parts by mass of the silicon compound A2 per 100 parts by mass of the silicon compound A1.

From the perspective of obtaining superior curability, the melting point or softening point of the silicon compound A1 is preferably greater than 25° C. and more preferably is from 50 to 80° C.

The silicon compound A1 is, for example, a compound expressed by Formula (1) above. From the perspective of imparting gas barrier properties, the silicon compound A1 preferably has a silsesquioxane skeleton.

Specific examples of the silicon compound A1 include silicon compounds expressed by Formula (1-1).

$$(R^1SiO_{3/2})_a(XO_{1/2})_e \quad (1-1)$$

In this formula, $R^1$ are identical or differing monovalent organic groups, "X" is a hydrogen atom or a monovalent organic group, "a" is a positive number, "e" is 0 or a positive number, and e/(a+b+c+d) is a number from 0.01 to 1.5.

A manufacturing method of the silicon compound A1 is not particularly limited. Examples thereof include conventionally known methods. From the perspective of ease of handling, a weight-average molecular weight of the silicon compound A1 is preferably from 100 to 100,000, and more preferably from 500 to 10,000. Note that in the present technology, the weight-average molecular weight of the component (A) is a weight-average molecular weight indicated by the molecular weight of polystyrene, determined by gel permeation chromatography (GPC) using chloroform as the solvent.

From the perspective of being a liquid at room temperature and having superior handling, the melting point or softening point of the silicon compound A2 is preferably not greater than 25° C.

Additionally, examples of preferable forms of the silicon compound A2 include DT resins and T resins.

Examples of the silicon compound A2 include
a partially hydrolytic condensate of a hydrolytic condensable silane compound expressed by Formula (2) below, having not more than 30 mass % of hydrolyzable groups;
a silicone alkoxy oligomer; and
a compound having an alkoxysilyl group on at least one end and three or more alkoxy groups (derived from alkoxysilyl groups) in the molecule (hereinafter, this compound is referred to as "compound A2'").

Constituents having silsesquioxane skeletons are not included in the silicon compound A2.

The silicon compound A2 can, for example, be a partially hydrolytic condensate of a hydrolytic condensable silane compound expressed by Formula (2) below, having not more than 30 mass % of hydrolyzable groups. Here, the "ratio of hydrolyzable groups in the silicon compound A2" is a value determined from proton and carbon nuclear magnetic resonance spectra.

$$(R^4)_m(OR^5)_nSiO_{(4-m-n)/2} \quad (2)$$

In this formula, $R^4$ are identical or differing alkyl groups, alkenyl groups, or aryl groups having from 1 to 6 carbons; $R^5$ are identical or differing hydrogen atoms, or alkyl groups, alkenyl groups, alkoxyalkyl groups, or acyl groups having from 1 to 6 carbons; "m" is a number satisfying $0.5 \leq m < 2.0$; and "n" is a number satisfying $0 < n < 2$. However, $1 < m+n \leq 3$. A configuration in which m+n is $1.05 < m+n \leq 3$ is possible.

In Formula (2), examples of the groups represented by $R^4$ include the groups represented by $R^1$ to $R^3$ in Formula (1) above; and examples of the groups represented by $R^5$ include the groups represented by "X" in Formula (1) above. Among these, the groups represented by $R^4$ are preferably alkyl groups having from 1 to 6 carbons and, from the perspectives of having superior heat resistance and increasingly superior heat resistant coloration stability, are preferably methyl groups. Additionally, the groups represented by $R^5$ are preferably alkyl groups having from 1 to 6 carbons. Note that the alkyl group having from 1 to 6 carbons ($R^5$) in the compound expressed by Formula (2) can, for example, include a hetero atom such as an oxygen atom. Additionally, when the groups represented by $R^5$ are acyl groups, examples of the acyl groups include acetyl groups, propionyl groups, butyryl groups, isobutyryl groups, and valeryl groups.

The partially hydrolytic condensate expressed by Formula (2) can include a hydrolyzable group: $OR^5$. From the perspective of obtaining superior curability, an amount of the hydrolyzable group included in the partially hydrolytic condensate expressed by Formula (2) is preferably not greater than 30 mass % and more preferably from 10 to 25 mass % per molecule of the partially hydrolytic condensate expressed by Formula (2).

From the perspective of being readily available, the silicon compound A2 is, for example, preferably a partially hydrolytic condensate of a methyltrimethoxysilane or a partially hydrolytic condensate of a mixture of a methyltrimethoxysilane and a dimethyldimethoxysilane.

Examples of the silicon compound A2 include silicone alkoxy oligomers such as a methylmethoxy oligomer. The silicone alkoxy oligomer is a silicone resin that has a polyorganosiloxane backbone, wherein the end of the molecule is closed by an alkoxysilyl group.

Examples of the methylmethoxy oligomer include products expressed by Formula (5) below.

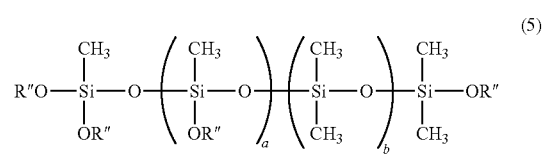

In this formula, "R" is a methyl group; "a" is an integer from 1 to 100; and "b" is an integer from 0 to 100.

Commercially available products can, for example, be used for the methylmethoxy oligomer. Examples of commercially available methylmethoxy oligomers include x-40-9246 (weight-average molecular weight: 6,000, manufactured by Shin-Etsu Chemical Co., Ltd.) and x-40-9225 (weight-average molecular weight: 3,400, manufactured by Shin-Etsu Chemical Co., Ltd.).

An example of a preferable form of the silicon compound A2 is a compound having an alkoxysilyl group on at least one end and three or more alkoxy groups (derived from alkoxysilyl groups) in the molecule (hereinafter, this compound is referred to as "compound A2'"). The compound A2' can, for example, be obtained as a reactant of de-alcohol condensing one or more moles of a silane compound including an alkoxysilyl group per one mole of a polysiloxane having silanol groups at both ends.

Examples of the silane compound having an alkoxy group used in the production of the compound A2' include compounds expressed by Formula (2) above: $R^4{}_mSi(OR^5)_nO_{(4-m-n)/2}$.

Examples of the polysiloxane having silanol groups on both ends used in the production of the silicon compound A2' include the same compounds as those expressed by Formula (3), described below in "1.3 Component (C)" of the present specification. A molecular weight of the compound expressed by Formula (3) can be adjusted so as to be not greater than 50,000.

Examples of the silicon compound A2' include products expressed by Formula (6) below.

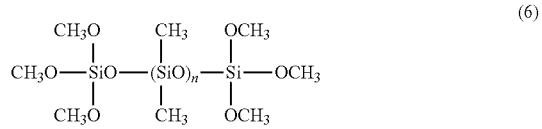

In this formula, "n" is an integer greater than or equal to 1.

A manufacturing method of the silicon compound A2 is not particularly limited. Examples thereof include conventionally known methods. From the perspective of ease of handling, a weight-average molecular weight of the silicon compound A2 is preferably from 100 to 100,000, and more preferably from 500 to 10,000.

Note that in the present technology, if only the structures of, for example, the partially hydrolytic condensate of the hydrolytic condensable silane compound having not greater than 30 mass % of hydrolyzable groups expressed by Formula (2), the silicone alkoxy oligomer, and the compound having an alkoxysilyl group on at least one end and three or more alkoxy groups (derived from alkoxysilyl groups) in the molecule (referred to collectively as "silicon compound A'") are described, said silicon compound A' can be configured so as not to be completely included in the range of the silicon compound expressed by Formula (1). In other words, the structure of the silicon compound A' (the partially hydrolytic condensate of the hydrolytic condensable silane compound having not greater than 30 mass % of hydrolyzable groups expressed by Formula (2), or the like) can include compounds that are outside the range of Formula (1). Thus, the composition of the present technology can include 100 parts by mass of a silicon compound expressed by Formula (1) and/or the silicon compound A' (e.g. the partially hydrolytic condensate of the hydrolytic condensable silane compound having not greater than 30 mass % of hydrolyzable groups expressed by Formula (2), or the like) and from 0.001 to 10 parts by mass of the condensation catalyst. In this case, the silicon compound expressed by Formula (1) is a compound having a melting point or softening point greater than 25° C. (e.g. the silicon compound A1), and the silicon compound A' is a compound having a melting point or softening point of not greater than 25° C. (e.g. the partially hydrolytic condensate of the hydrolytic condensable silane compound having not greater than 30 mass % of hydrolyzable groups expressed by Formula (2), the silicone alkoxy oligomer, or the compound having an alkoxysilyl group on at least one end and three or more alkoxy groups (derived from alkoxysilyl groups) in the molecule); and both constituents can be distinguished. Additionally, constituents having silsesquioxane skeletons are not included in the silicon compound A'. Details of each of the compounds are the same.

Thus, the composition of the present technology can be configured as a heat-curable silicone resin composition for sealing optical semiconductors including the silicon compound expressed by Formula (1) having a melting point or softening point greater than 25° C. and/or the silicon compound A' having a melting point or softening point not greater than 25° C. (e.g. the partially hydrolytic condensate of the hydrolytic condensable silane compound having not greater than 30 mass % of hydrolyzable groups expressed by Formula (2), or the like).

Additionally, when the composition of the present technology includes the silicon compound expressed by Formula (1) having a melting point or softening point greater than 25° C. and further includes the silicon compound A' having a melting point or softening point not greater than 25° C. (e.g. the partially hydrolytic condensate of the hydrolytic condensable silane compound having not greater than 30 mass % of hydrolyzable groups expressed by Formula (2) or the like), from the perspective of obtaining superior curability, an amount of the silicon compound A' having a melting point or softening point not greater than 25° C. is preferably from 0 to 500 parts by mass and more preferably from 0 to 100 parts by mass per 100 parts by mass of the silicon compound expressed by Formula (1) having a melting point or softening point greater than 25° C.

Note that hereinafter, this definition of the component (A) also applies in cases where the silicon compound expressed by Formula (1) having a melting point or softening point greater than 25° C. and/or the silicon compound A' having a melting point or softening point not greater than 25° C. (e.g. the partially hydrolytic condensate of the hydrolytic condens-able silane compound having not greater than 30 mass % of hydrolyzable groups expressed by Formula (2) or the like) is included.

1.2. Component (B)

The condensation catalyst (component (B)) is thought to function as a catalyst for curing the composition of the present technology and promote the crosslinking reaction of the component (A).

More specifically, the component (B) can be activated by heating and can condense a silanol group (e.g. via reactions between silanol groups or between a silanol group and an alkoxysilyl group). Thereby, by heating, the component (B) can thoroughly and uniformly cure the composition of the present technology.

A single component (B) can be used or a combination of two or more of the component (B) can be used.

Examples of the component (B) include zirconium compounds, zinc compounds, and other transition metal compounds and base metal compounds.

For example, when the composition of the present technology includes one type or two or more types of the component (B), at least one type of the component (B) can be a zirconium compound and/or a zinc compound. Additionally, when the composition of the present technology includes two or more types of the component (B), the component (B) can include both a transition metal compound and a base metal compound.

An example of a preferable form of the condensation catalyst (B) is one that includes an organic group. The condensation catalyst (B) can be bonded to an organic group (hydrocarbon group) via, for example, a hetero atom such as an oxygen atom, a nitrogen atom, or a sulfur atom and/or via a linking group such as an ester bond. Examples of the organic group (hydrocarbon group) include aliphatic hydrocarbon groups (including open chain, branched chain, cyclic, and combinations thereof; and the aliphatic hydrocarbon group can have unsaturated bonds), aromatic hydrocarbon groups, and combinations thereof. The organic group (hydrocarbon group) can contain a hetero atom such as, for example, an oxygen atom, a nitrogen atom, and a sulfur atom. Examples of organic groups (hydrocarbon groups) having linking groups include organic carboxylates (—O—CO—R); groups in which a hydrocarbon group is bonded to an oxy group (—O—R) such as alkoxy groups and phenoxy groups; ligands; and combinations thereof.

1.2.1. Zirconium Compound

More specifically, the zirconium compound can be a compound (compound B1) expressed by Formula (7) below and/or a compound (compound B2) expressed by Formula (8) below. The zirconium compound can include an organic group.

(7)

In this formula, $R^9$ is a hydrocarbon group having from 1 to 18 carbons.

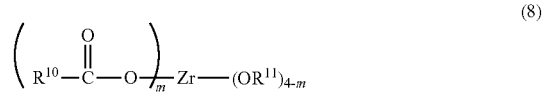

(8)

In this formula, $R^{10}$ are identical or differing hydrocarbon groups having from 1 to 16 carbons; $R^{11}$ are identical or differing hydrocarbon groups having from 1 to 18 carbons; and "m" is an integer from 1 to 3.

1.2.1-1. Compound B1

The compound B1 is a zirconium metal salt including zirconyl $[(Zr=O)^{2+}]$ as a constituent. The composition of the present technology including the compound B1 has increasingly superior curability.

The acid used to manufacture the compound B1 (zirconium metal salt) is not particularly limited. Examples thereof include carboxylate salt. Examples of the carboxylate salt include aliphatic carboxylic acids such as acetic acid, propionic acid, octylic acid (2-ethylhexanoic acid), nonanoic acid, stearic acid, and lauric acid; cycloaliphatic carboxylic acids such as naphthenic acid and cyclohexanecarboxylic acid; and aromatic carboxylic acids such as benzoic acid.

From the perspective of obtaining superior reliability over an extended period of time at high temperatures (e.g. being able to suppress peeling and cracking, and having superior durability), the compound B1 is preferably an aliphatic carboxylate salt and/or a cycloaliphatic carboxylate salt, and is more preferably a cycloaliphatic carboxylate salt.

In this case, examples of the aliphatic carboxylate salt include zirconium dioctylate and zirconium dineodecanoate; examples of the cycloaliphatic carboxylate salt include cycloaliphatic carboxylate salts such as zirconium naphthenate and zirconium cyclohexanoate; and examples of the aromatic carboxylate salt include zirconium benzoate. From the perspectives of obtaining superior reliability over an extended period of time at high temperatures and superior curability, when the compound B1 is used as the component (B), the compound B1 is preferably zirconium dioctylate and/or zirconium naphthenate.

1.2.1-2. Compound B2

As expressed by Formula (8) above, the compound B2 has from 1 to 3 acyl groups ($R^{10}$—CO—). With the compound B2 expressed by Formula (8), the acyl groups are included in Formula (8) as carboxylate esters. In Formula (8), the plurality of $R^{10}$ moieties may be identical or different.

From the perspectives of obtaining increasingly superior heat resistant coloration stability and compatibility (e.g. compatibility with silicone resin), in Formula (8), the number of carbons of the hydrocarbon groups represented by $R^{10}$ is preferably from 3 to 16 and more preferably from 4 to 16.

Examples of the hydrocarbon groups represented by $R^{10}$ include aliphatic hydrocarbon groups, cycloaliphatic hydrocarbon groups, aromatic hydrocarbon groups, and combinations thereof. The hydrocarbon groups may be straight or branched. The hydrocarbon groups can contain an unsaturated bond. The hydrocarbon groups can contain a hetero atom such as, for example, an oxygen atom, a nitrogen atom, and a sulfur atom. From the perspectives of obtaining superior reliability over an extended period of time at high temperatures, superior curability, increasingly superior heat resistant coloration stability, and superior compatibility, the hydrocarbon groups represented by $R^{10}$ are preferably cycloaliphatic hydrocarbon groups and/or aliphatic hydrocarbon groups.

From the perspectives of obtaining increasingly superior heat resistant coloration stability and superior compatibility, the hydrocarbon groups represented by $R^{10}$ preferably have a ring structure. In this case, examples of the ring structure include cycloaliphatic hydrocarbon groups, aromatic hydrocarbon groups, and combinations thereof. In addition to a ring structure, $R^{10}$ can have, for example, an aliphatic hydrocarbon group.

Examples of the cycloaliphatic hydrocarbon group include cycloalkyl groups such as a cyclopropyl group, a cyclobutyl group, a cyclopentyl group, a cyclohexyl group, a cycloheptyl group, and a cyclooctyl group; a naphthene ring (a cycloparaffin ring derived from naphthenic acid); and fused ring hydrocarbon groups such as an adamanthyl group and a norbornyl group.

Examples of the aromatic hydrocarbon group include phenyl groups, naphthyl groups, and azulene.

Examples of the aliphatic hydrocarbon group include methyl groups, ethyl groups, propyl groups, isopropyl groups, butyl groups, isobutyl groups, pentyl groups, hexyl groups, octyl groups, 2-ethylhexyl groups, nonyl groups, decyl groups, and undecyl groups.

Among these, from the perspectives of obtaining increasingly superior heat resistant coloration stability and superior compatibility, the hydrocarbon groups represented by $R^{10}$ are preferably cycloaliphatic hydrocarbon groups and aromatic hydrocarbon groups; are more preferably cyclopropyl groups, cyclopentyl groups, cyclohexyl groups, adamanthyl groups, naphthene rings, ($R^{10}COO$— as the naftate group), and phenyl groups; and even more preferably cyclopropyl groups, cyclopentyl groups, cyclohexyl groups, adamanthyl groups, and naphthene rings.

Examples of the $R^{10}COO$— having the cycloaliphatic hydrocarbon group include cycloalkylcarbonyloxy groups such as cyclopropylcarbonyloxy groups, cyclobutylcarbonyloxy groups, cyclopentylcarbonyloxy groups, cyclohexylcarbonyloxy groups (cyclohexylcarbonate groups), cycloheptylcarbonyloxy groups (cycloheptylcarbonate groups), and cyclooctylcarbonyloxy groups; naftate groups (naphthenic acid esters); and carbonyloxy groups of fused ring hydrocarbon groups such as adamanthylcarbonyloxy groups and norbornylcarbonyloxy groups.

Examples of the $R^{10}COO$— having the aromatic hydrocarbon group include phenylcarbonyloxy groups, naphthylcarbonyloxy groups, and azulylcarboxy groups.

Examples of the $R^{10}COO$— having the aliphatic hydrocarbon group include acetates, propionates, butyrates, isobutyrates, octylic acid ester, 2-ethylhexanoic acid ester, nonanoic acid ester, and lauric acid ester.

Among these, from the perspectives of obtaining increasingly superior heat resistant coloration stability and superior compatibility, the $R^{10}COO$— having the cycloaliphatic hydrocarbon group, the $R^{10}COO$— having the aromatic hydrocarbon group, and 2-ethylhexanoate are preferable; cyclopropylcarbonyloxy groups, cyclopentylcarbonyloxy groups, cyclohexylcarbonyloxy groups, adamanthylcarbonyloxy groups, naftate groups, and phenylcarbonyloxy groups are more preferable; and cyclopropylcarbonyloxy groups, cyclopentylcarbonyloxy groups, cyclohexylcarbonyloxy groups, adamanthylcarbonyloxy groups, and naftate groups are even more preferable.

Additionally, from the perspectives of obtaining increasingly superior heat resistant coloration stability and superior compatibility, the number of carbons of the hydrocarbon groups represented by $R^{11}$ is preferably from 3 to 8.

Examples of the hydrocarbon groups represented by $R^{11}$ include aliphatic hydrocarbon groups, cycloaliphatic hydrocarbon groups, aromatic hydrocarbon groups, and combinations thereof. The hydrocarbon groups may be straight or branched. The hydrocarbon groups can contain an unsaturated bond. The hydrocarbon groups can contain a hetero atom such as, for example, an oxygen atom, a nitrogen atom, and a sulfur atom. From the perspectives of obtaining increasingly superior heat resistant coloration stability and superior compatibility, the hydrocarbon groups represented by $R^{11}$ are preferably aliphatic hydrocarbon groups.

Examples of the $R^{11}O$— having the aliphatic hydrocarbon group (alkoxy group) include methoxy groups, ethoxy groups, propoxy groups, isopropoxy groups, butoxy groups, pentyloxy groups, hexyloxy groups, and octyloxy groups. Among these, from the perspectives of obtaining increasingly superior heat resistant coloration stability and superior compatibility, the $R^{11}O$— having the aliphatic hydrocarbon group (alkoxy group) is preferably a methoxy group, an ethoxy group, a propoxy group, a butoxy group, a pentyloxy group, or an isopropoxy group.

Examples of the compound B2 having the cycloaliphatic hydrocarbon group as the ring structure include: zirconium alkoxy cyclopropane carboxylates such as zirconium trialkoxy monocyclopropane carboxylate, zirconium dialkoxy dicyclopropane carboxylate, and zirconium monoalkoxy tricyclopropane carboxylate;

zirconium alkoxy cyclopentane carboxylates such as zirconium trialkoxy monocyclopentane carboxylate, zirconium dialkoxy dicyclopentane carboxylate, and zirconium monoalkoxy tricyclopentane carboxylate;

zirconium alkoxy cyclohexane carboxylates such as zirconium tributoxy monocyclohexane carboxylate, zirconium dibutoxy dicyclohexane carboxylate, zirconium monobutoxy tricyclohexane carboxylate, zirconium triisopropoxy monocyclohexane carboxylate, zirconium diisopropoxy dicyclohexane carboxylate, and zirconium monoisopropoxy tricyclohexane carboxylate;

zirconium alkoxy adamantane carboxylates such as zirconium trialkoxy monoadamantane carboxylate, zirconium dialkoxy diadamantane carboxylate, and zirconium monoalkoxy triadamantane carboxylate; and zirconium alkoxy naftates such as zirconium tributoxy mononaftate, zirconium dibutoxy dinaftate, zirconium monobutoxy trinaftate, zirconium triisopropoxy mononaftate, zirconium diisopropoxy dinaftate, and zirconium monoisopropoxy trinaftate.

Examples of the compound B2 having the aromatic hydrocarbon group as the ring structure include zirconium alkoxy benzene carboxylates such as zirconium tributoxy monobenzene carboxylate, zirconium dibutoxy dibenzene carboxylate, zirconium monobutoxy tribenzene carboxylate, zirconium triisopropoxy monobenzene carboxylate, zirconium diisopropoxy dibenzene carboxylate, and zirconium monoisopropoxy tribenzene carboxylate.

Examples of the compound B2 having the aliphatic hydrocarbon group include: zirconium alkoxy butyrates such as zirconium tributoxy monoisobutyrate, zirconium dibutoxy diisobutyrate, zirconium monobutoxy triisobutyrate, zirconium triisopropoxy monoisobutyrate, zirconium diisopropoxy diisobutyrate, and zirconium monoisopropoxy triisobutyrate;

zirconium alkoxy 2-ethylhexanoates such as zirconium tributoxy mono(2-ethylhexanoate), zirconium dibutoxy di(2-ethylhexanoate), zirconium monobutoxy tri(2-ethylhexanoate), zirconium triisopropoxy mono(2-ethylhexanoate), zirconium diisopropoxy di(2-ethylhexanoate), and zirconium monoisopropoxy tri(2-ethylhexanoate); and zirconium alkoxy neodecanates such as zirconium tributoxy mononeodecanate, zirconium dibutoxy dineodecanate, zirconium monobutoxy trineodecanate, zirconium triisopropoxy mononeodecanate, zirconium diisopropoxy dineodecanate, and zirconium monoisopropoxy trineodecanate.

Among these, from the perspectives of obtaining increasingly superior heat resistant coloration stability and superior compatibility, when the compound B2 is used as the component (B), the compound B2 having the cycloaliphatic hydrocarbon group as the ring structure and the compound B2 having the aromatic hydrocarbon group as the ring structure are preferable; zirconium trialkoxy mononaftate, zirconium trialkoxy monoisobutyrate, zirconium trialkoxy mono(2-ethylhexanoate), zirconium trialkoxy monocyclopropane carboxylate, zirconium trialkoxy cyclobutane carboxylate, zirconium trialkoxy monocyclopentane carboxylate, zirconium trialkoxy monocyclohexane carboxylate, zirconium trialkoxy monoadamantane carboxylate, and zirconium trialkoxy mononaftate are more preferable; and zirconium tributoxy mononaftate, zirconium tributoxy monoisobutyrate, zirconium tributoxy mono(2-ethylhexanoate), zirconium tributoxy monocyclopropane carboxylate, zirconium tributoxy monocyclopentane carboxylate, zirconium tributoxy monocyclohexane carboxylate, zirconium tributoxy monoadamantane carboxylate, and zirconium tributoxymononaftate are even more preferable.

From the perspective of obtaining increasingly superior heat resistant coloration stability, the compound B2 is preferably an alkoxy group-containing zirconium metal salt having from 1 to 3 acyl groups (ester bonds).

Examples of the alkoxy group-containing zirconium metal salt having from 1 to 3 acyl groups include zirconium tributoxy mononaftate, zirconium tributoxy monoisobutyrate, zirconium tributoxy mono(2-ethylhexanoate), zirconium tributoxy mononeodecanate, zirconium dibutoxy dinaftate, zirconium dibutoxy diisobutyrate, zirconium dibutoxy di(2-ethylhexanoate), zirconium dibutoxy dineodecanate, zirconium monobutoxy trinaftate, zirconium monobutoxy triisobutyrate, zirconium monobutoxy tri(2-ethylhexanoate), and zirconium monobutoxy trineodecanate.

Among these, from the perspectives of obtaining increasingly superior heat resistant coloration stability and superior compatibility, when the compound B2 is used as the component (B), the compound B2 is preferably at least one selected from the group consisting of zirconium tributoxymononaftate, zirconium tributoxy monoisobutyrate, and zirconium tributoxy mono(2-ethylhexanoate).

Examples of a method for producing the compound B2 include mixing not less than 1 mole and less than 4 moles of the carboxylic acid expressed by $R^{10}$—COOH [$R^{10}$ are identical or differing hydrocarbon groups having from 1 to 16 carbons; $R^{10}$ is synonymous with $R^{10}$ of Formula (8)] per 1 mole of $Zr(OR^{11})_4$ [zirconium tetraalkoxide; $R^{11}$ are identical or differing hydrocarbon groups having from 1 to 18 carbons; $R^{11}$ is synonymous with $R^{11}$ of Formula (8)] in a nitrogen atmosphere at from 20 to 80° C.

Additionally, D. C. Bradley, "Metal alkoxide", Academic Press, 1978 can be referenced for information about the reaction between Zr alcoholate and carboxylic acid.

Examples of the $Zr(OR^{11})_4$ that can be used in the production of the compound B2 include zirconium tetramethoxide, zirconium tetraethoxide, zirconium tetranormalpropoxide, zirconium tetraisopropoxide, and zirconium tetranormalbutoxide.

Examples of the carboxylic acid that can be used in the production of the compound B2 include aliphatic carboxylic acids such as acetic acid, propionic acid, isobutyric acid, octylic acid, 2-ethylhexanoic acid, nonanoic acid, and lauric acid; cycloaliphatic carboxylic acids such as naphthenic acid, cyclopropane carboxylic acid, cyclopentane carboxylic acid, cyclohexyl carboxylic acid (cyclohexane carboxylic acid), adamantane carboxylic acid, and norbornane carboxylic acid; and aromatic carboxylic acids such as benzoic acid.

A description of the zinc compound is given below. The zinc compound that the composition of the present technology can include as the condensation catalyst (B) is not particularly limited provided that it is a compound including zinc. Examples thereof include zinc salts; zinc complexes; zinc alcoholates; zinc oxides such as zinc flowers, zinc stannates, and the like; two-element and/or multi-element metal oxides including zinc, salts and/or complexes thereof, and combinations thereof.

Examples of the zinc compound include compounds expressed by Formula (1) and Formula (2) below.

(1)

In Formula (1), $R^1$ is an alkyl group or an aryl group having from 1 to 18 carbons.

Examples of the alkyl group include methyl groups, ethyl groups, propyl groups, isopropyl groups, butyl groups, isobutyl groups, pentyl groups, hexyl groups, octyl groups, 2-ethylhexyl groups, nonyl groups, decyl groups, and undecyl groups. Examples of the aryl group include phenyl groups, naphthyl groups, and azulene.

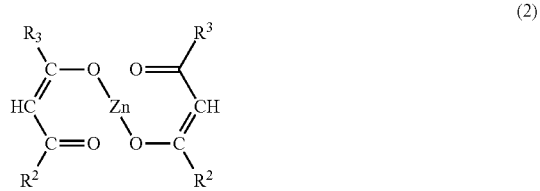

(2)

In Formula (2), $R^2$ and $R^3$ are identical or differing monovalent hydrocarbon groups having from 1 to 18 carbons or alkoxy groups. In Formula (2), identical $R^2$ and $R^3$ moieties in ($R^2$COCHCO$R^3$) may be interchanged.

Examples of the monovalent hydrocarbon groups having from 1 to 18 carbons include alkyl groups and aryl groups having from 1 to 18 carbons. The alkyl groups and aryl groups having from 1 to 18 carbons are synonymous with those described above.

Examples of the alkoxy groups include methoxy groups, ethoxy groups, and propoxy groups.

Examples of the zinc compound include carboxylate salts such as zinc aliphatic carboxylates including zinc acetate, zinc acetylacetate, (2-ethylhexanoic acid)zinc, zinc octylate, zinc neodecanoate, zinc laurate, and zinc stearate, zinc cycloaliphatic carboxylates including zinc naphthenate, zinc aromatic carboxylates including zinc benzoate, zinc p-tert-butyl benzoate, zinc salicylate, and the like; zinc(meth)acrylate; and zinc chelates such as zinc acetylacetonate [Zn(II) acetylacetonate, Zn(acac)$_2$], and zinc 2,2,6,6-tetramethyl-3,5-heptanedionate. Among these, from the perspective of obtaining superior solubility, (2-ethylhexanoic acid)zinc and zinc naphthenate are preferable.

When the composition of the present technology includes the zirconium compound and/or the zinc compound as the component (B), from the perspectives of obtaining increasingly superior heat resistant coloration stability and superior storage stability, an amount of the zirconium compound, an amount of the zinc compound, or a total amount of the zirconium compound and the zinc compound is preferably from 0.001 to 1 part by mass, more preferably from 0.001 to 0.5 parts by mass, and even more preferably from 0.001 to 0.05 parts by mass per 100 parts by mass of the component (A) [where component (A) is the silicon compound expressed by Formula (1) or, alternatively, the silicon compound expressed by Formula (1) and/or the silicon compound A'].

Note that when using the zirconium compound and the zinc compound in combination, from the perspectives of obtaining increasingly superior heat resistant coloration stability and superior storage stability, the amount of the zinc compound with respect to the zirconium compound is preferably such that 0.01 to 100 parts by mass of the zinc compound, more preferably such that 0.1 to 10 parts by mass, and even more preferably such that 0.1 to 1 part by mass is included per 1 part by mass of the zirconium compound.

1.2.2. Transition Metal Compound and Base Metal Compound

Examples of the transition metal compound include titanium, zirconium, hafnium, niobium, iron, and the like.

An ionization tendency of the base metal included in the base metal compound can be made greater than that of hydrogen. Examples of the base metal compound include aluminum, tin, bismuth, zinc, and the like.

When the base metal compound is a tin compound, the tin compound preferably is a quaternary tin compound having an alkyl group and an acyl group (compound B3). In the present technology, the compound B3 can include an acyl group as an ester bond.

Examples of the compound B3 include dibutyltin diacetate, dibutyltin dioctate, and dibutyltin dilaurate. Examples of the quaternary tin compound, as the compound B3, having at least one alkyl group and at least one acyl group include compounds expressed by Formula (9) below, and bis-type compounds expressed by Formula (9).

$$R^{12}{}_a-Sn-[O-CO-R^{13}]_{4-a}$$ (9)

In this formula, $R^{12}$ is an alkyl group; $R^{13}$ is a hydrocarbon group; and "a" is an integer from 1 to 3.

Examples of the alkyl group represented by $R^{12}$ include alkyl groups with 1 or more carbons, specifically, methyl groups, ethyl groups, propyl groups, butyl groups, pentyl groups, and octyl groups.

The hydrocarbon group represented by $R^{13}$ is not particularly limited. Examples thereof include aliphatic hydrocarbon groups such as methyl groups and ethyl groups, cycloaliphatic hydrocarbon groups, aromatic hydrocarbon groups, and combinations thereof. The hydrocarbon group may be straight or branched. The hydrocarbon group can contain an unsaturated bond. The hydrocarbon group can contain a hetero atom such as, for example, an oxygen atom, a nitrogen atom, and a sulfur atom.

Examples of the bis-type compound expressed by Formula (9) include compounds expressed by the formula below.

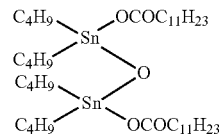

Examples of the compound B3 include, dialkyltin compounds such as dibutyltin diacetate, dibutyltin dioctate, dibutyltin dilaurate, dioctyltin diacetate, and dioctyltin maleate (compound expressed by Formula (9) above where "a"=2); dimeric dialkyltins such as dibutyltin oxyacetate dibutyltin oxyoctylate, dibutyltin oxylaurate dibutyltin bismethylmalate, and dibutyltin oxyoleate; or dibutyltin malate polymers and dioctyltin malate polymers; and monobutyltin tris (2-ethylhexanoate) (compound expressed by Formula (9) above where "a"=1).

Among these, from the perspectives of obtaining increasingly superior heat resistant coloration stability, dibutyltin diacetate, dibutyltin dioleate, dibutyltin dilaurate, dibutyltin oxyacetate dibutyltin oxyoctylate, and dibutyltin oxylaurate are preferable.

A single compound B3 can be used or a combination of two or more can be used. Production of the compound B3 is not particularly limited and examples thereof include conventionally known methods.

From the perspectives of obtaining increasingly superior heat resistant coloration stability and superior storage stability, when the composition of the present technology includes the transition metal compound and the base metal compound as the component (B), preferably from 0.001 to 1 part by mass, more preferably from 0.001 to 0.5 parts by mass, and even more preferably from 0.001 to 0.05 parts by mass of the transition metal compound are included per 100 parts by mass of the component (A) [where component (A) is the silicon compound expressed by Formula (1) or, alternately, the silicon compound expressed by Formula (1) and/or the silicon compound A']. Additionally, in this case, preferably from 0.001 to 1 part by mass, more preferably from 0.001 to 0.5 parts by mass, and even more preferably from 0.001 to 0.05 parts by mass of the base metal compound are included per 100 parts by mass of the component (A) [where component (A) is the silicon compound expressed by Formula (1) or, alternately, the silicon compound expressed by Formula (1) and/or the silicon compound A']. Note that in this case, the amount of the base metal compound with respect to the transition metal compound is preferably such that 0.01 to 100 parts by mass, more preferably such that 0.1 to 10 parts by mass, and even more preferably such that 0.1 to 1 part by mass of the base metal compound is included per 1 part by mass of the transition metal compound.

From the perspective of obtaining superior gas barrier properties (e.g. sulfur resistance), the composition of the present technology can be a composition substantially including the component (A) [where component (A) is the silicon compound expressed by Formula (1) or, alternately, the silicon compound expressed by Formula (1) and/or the silicon compound A'] and the component (B) (a composition including only the two components described above; and also the component (C) described below). Here, "a composition substantially including ..." means that components other than the two components described above account for not more than 5 mass % of the composition.

1.3. Component (C)

The composition of the present technology can include from 1 to 1,000 parts by mass of a component (C), which is a compound having a molecular weight of not more than 50,000 expressed by Formula (3) below and/or a compound having a molecular weight of not more than 5,000 expressed by Formula (4), per 100 parts by mass of the component (A) [where component (A) is the silicon compound expressed by Formula (1) or, alternately, the silicon compound expressed by Formula (1) and/or the silicon compound A']. The composition can be imparted with flexibility and suitable viscosity by including the component (C) in the composition of the present technology at the ratio described above.

$$HO(R^6{}_2SiO)_m(R^6R^7SiO)_nH \qquad (3)$$

In this formula, $R^6$ is a monovalent hydrocarbon group having from 1 to 20 carbons, $R^7$ is a monovalent hydrocarbon group having from 2 to 20 carbons that is different from $R^6$, "m" is an integer greater than or equal to 0, and "n" is an integer greater than or equal to 3.

$$XO((R^6)_2SiO)_nX \qquad (4)$$

In this formula, $R^6$ are identical or differing groups defined in Formula (3) above, "n" is an integer greater than or equal to 3, and "X" is a hydrogen atom or a monovalent hydrocarbon group having from 1 to 6 carbons.

Examples of the monovalent hydrocarbon group represented by $R^6$ include monovalent hydrocarbon groups such as alkyl groups having from 1 to 20 carbons (e.g. methyl groups, ethyl groups, n-propyl groups, isopropyl groups, n-butyl groups, isobutyl groups, tert-butyl groups, n-pentyl groups, isopentyl groups, neopentyl groups, cyclopentyl groups, tert-pentyl groups, 2-methylbutyl groups, 1-methylbutyl groups, n-hexyl groups, isohexyl groups, cyclohexyl groups, 3-methylpentyl groups, 2-methylpentyl groups, 1-methylpentyl groups, heptyl groups, cycloheptyl groups, octyl groups, isooctyl groups, 2-ethylhexyl groups, n-nonyl groups, n-decyl groups, n-undecyl groups, n-dodecyl groups, n-tridecyl groups, n-tetradecyl groups (myristyl groups), n-hexadecyl groups (palmityl groups), n-octadecyl groups (stearyl groups), n-icosyl groups, n-nonadecyl groups, and icosyl groups); alkenyl groups having from 1 to 20 carbons (e.g. vinyl groups, allyl groups, propenyl groups, isopropenyl groups, butenyl groups, isobutenyl groups, pentenyl groups, isopentenyl groups, hexenyl groups, heptenyl groups, octenyl groups, nonenyl groups, decenyl groups, undecenyl groups, dodecenyl groups, tetradecenyl groups, and oleyl groups); aryl groups having from 1 to 20 carbons (e.g. phenyl groups, and naphthyl groups); and the like.

Additionally, examples of the monovalent hydrocarbon group represented by $R^7$ include the groups (except the methyl groups) listed as examples of the monovalent hydrocarbon group represented by $R^6$ above. Furthermore, from the perspective of increasing compatibility with the component (A), the group represented by $R^7$ preferably is a monovalent hydrocarbon group having a ring structure. Examples of such a group include cyclopentyl groups, cyclohexyl groups, cyclopentyl groups, 2-cyclohexylethyl groups, 3-cyclohexenyl groups, 2-norbornyl groups, and the like.

In Formula (3) and Formula (4), from the perspectives of obtaining increasingly superior compatibility with the component (A), improving transparency, and displaying greater gas barrier properties, the monovalent hydrocarbon group represented by $R^6$ preferably has from 1 to 18 carbons and more preferably has from 1 to 10 carbons. Additionally, in Formula (3), from the perspectives of obtaining increasingly superior compatibility with the component (A), further improving transparency, and displaying even greater gas barrier properties, the monovalent hydrocarbon group represented by $R^7$ preferably has from 2 to 20 carbons and more preferably has from 2 to 10 carbons.

Examples of the compound expressed by Formula (3) above include methylcyclohexylpolysiloxanes capped on both ends with hydroxyl groups (in Formula (3), the compound where $R^6$ is a methyl group and $R^7$ is a cyclohexyl group) and methylcyclohexyldimethylpolysiloxanes capped on both ends with hydroxyl groups; and examples of the compound expressed by Formula (4) above include dimethylpolysiloxanes capped at both ends by dimethyl methoxy siloxy groups (in Formula (4), the compound where the two $R^6$ moieties are both methyl groups).

When the composition of the present technology includes the component (C), from the perspective ensuring that the addition thereof does not inhibit the gas barrier properties, an amount of the component (C) is preferably from 1 to 1,000 parts by mass and more preferably from 10 to 300 parts by mass per 100 parts by mass of the component (A) [where component (A) is the silicon compound expressed by Formula (1) or, alternatively, the silicon compound expressed by Formula (1) and/or the silicon compound A'].

A method of producing the component (C) is not particularly limited. Examples thereof include conventionally known methods. Additionally, from the perspectives of obtaining compatibility with the component (A) [where component (A) is the silicon compound expressed by Formula (1) or, alternatively, the silicon compound expressed by Formula (1) and/or the silicon compound A'], gas barrier properties, and because the viscosity will allow for ease of handling, a weight-average molecular weight of the component (C) when both of the two $R^6$ moieties on one silicon atom are methyl groups is preferably not greater than 5,000, and when one or both of the two $R^6$ moieties on one silicon atom are monovalent hydrocarbon groups having not less than 2 carbons is preferably not greater than 50,000, is more preferably not greater than 3,000 and not greater than 10,000, in each respective case, and is even more preferably not greater than 2,000 and not greater than 5,000 in each respective case. Note that in the present technology, the weight-average molecular weight of the component (C) is a weight-average molecular weight indicated by the molecular weight of polystyrene, determined by gel permeation chromatography (GPC) using chloroform as the solvent.

1.4. Other Components

Additionally, in addition to the component (A) [where component (A) is the silicon compound expressed by Formula (1) or, alternatively, the silicon compound expressed by Formula (1) and/or the silicon compound A'] and the component (B) (and furthermore the component (C)), the composition of the present technology can further include additives as necessary so long as the object and the effectiveness of the present technology are not hindered.

Examples of the additives include inorganic fillers, antioxidants, lubricants, UV absorbing agents, heat/light stabilizers, dispersing agents, antistatic agents, polymerization inhibitors, anti-foaming agents, curing accelerators, solvents, inorganic phosphors, antiaging agents, radical inhibitors, adhesive strength enhancers, flame retardants, surfactants, storage stability enhancers, ozone antiaging agents, thickening agents, plasticizers, radiation blockers, nucleators, coupling agents, conductivity imparting agents, phosphorous-based peroxide decomposers, pigments, metal inactivators, and physical property regulators. The additives are not particularly limited. Examples thereof include conventionally known products.

Examples of the inorganic phosphors include yttrium, aluminum, and garnet-based YAG phosphors, ZnS phosphors, $Y_2O_2S$ phosphors, red light emitting phosphors, blue light emitting phosphors, and green light emitting phosphors that are used commonly in LEDs.

From the perspective of obtaining superior storage stability, an example of a preferable form of the composition of the present technology is one that is essentially free of water. The present technology being "essentially free of water" means that a content of water in the composition of the present technology is not more than 0.1 mass %.

Additionally, from the perspective of obtaining superior workplace ease of use, an example of a preferable form of the composition of the present technology is one that is essentially free of solvents. The present technology being "essentially free of solvents" means that a content of solvents in the composition of the present technology is not more than 1 mass %.

1.5. Manufacturing

Manufacturing of the composition of the present technology is not particularly limited. The composition of the present technology can, for example, be manufactured by mixing the component (A) [where component (A) is the silicon compound expressed by Formula (1) or, alternatively, the silicon compound expressed by Formula (1) and/or the silicon compound A'], the component (B) (and furthermore, as necessary, the component (C)), and the additives. It is possible to produce the composition of the present technology as a one-component type composition or as a two-component type composition. The additives can be added to the first component and/or the second component.

1.6. Uses and Usage Methods

The composition of the present technology can be used as a composition for sealing an optical semiconductor and as a composition for an optical semiconductor lens.

The optical semiconductors to which the composition of the present technology can be applied are not particularly limited. Examples thereof include light emitting diodes (LED), organic electric field light emitting devices (organic EL), laser diodes, and LED arrays.

Examples of methods of use of the composition of the present technology include applying the composition of the present technology to an optical semiconductor, heating the optical semiconductor to which the composition of the present technology has been applied, and curing the composition of the present technology. The method for applying the composition of the present technology is not particularly limited. Examples thereof include methods using dispensers, potting processes, screen printing processes, transfer molding, and injection molding processes.

The composition of the present technology can be cured by heating.

From the perspectives of obtaining suitable lengths of curing time and workable life; being able to suppress foaming of the alcohol that is a by-product of condensation reactions; being able to suppress cracking in the cured product; and obtaining superior flatness, moldability, and physical properties of the molded product, curing is performed at a heating temperature preferably from 100° C. to 200° C. and more preferably about 150° C.

From the perspectives of obtaining superior curability and transparency, the heating can be performed under essentially anhydrous conditions. In the present technology, performing the heating under "essentially anhydrous conditions" means that moisture in the air of the environment where the heating is performed is not more than 10% RH.

The cured product (silicone resin) obtained by heating and curing the composition of the present technology can maintain a high level of transparency over an extended period of time when used on an LED (particularly a white LED), and has superior gas barrier properties (e.g. sulfur resistance), heat resistant coloration stability, and cracking resistance. The cross-linked portions and skeleton of the obtained cured product are all siloxane bonds. Therefore, the heat resistant coloration stability thereof is superior to that of conventional silicone resins.

Transmission, measured at a wavelength of 400 nm, of the cured product obtained using the composition of the present technology (when a thickness of the cured product is 2 mm), when measured using an ultraviolet-visible absorption spectrophotometer (manufactured by Shimadzu Corporation, same to follow) in accordance with JIS K0115:2004, is preferably not less than 80% and more preferably not less than 85%.

Additionally, the cured product obtained using the composition of the present technology is subjected to a heat resistance test after the initial curing (wherein the cured product after initial curing is allowed to sit for 10 days at 150° C.).

Transmission, measured at a wavelength of 400 nm, of the cured product obtained after the heat resistance test (thickness: 2 mm), when measured using an ultraviolet-visible absorption spectrophotometer in accordance with JIS K0115: 2004, is preferably not less than 80% and more preferably not less than 85%.

A retention rate of the transmittance of the cured product obtained using the composition of the present technology (transmission after heat resistance test/transmission at initial curing×100) is preferably from 70 to 100% and more preferably from 80 to 100%.

In addition to optical semiconductors, the composition of the present technology can be used in applications such as, for example, display materials, optical recording media materials, optical device materials, optical part materials, optical fiber materials, optical-electronic function organic materials, material around semiconductor integrated circuits, potting material for joining optical fiber, optical waveguide materials, lens coating materials, other optical materials, and the like.

2. Sealed Optical Semiconductor

Next, a description of the sealed optical semiconductor of the present technology is given below.

The sealed optical semiconductor of the present technology is a product formed by sealing an LED chip using the heat-curable silicone resin composition for sealing optical semiconductors of the present technology described above.

The sealed optical semiconductor of the present technology can be formed by sealing an LED chip by: applying the heat-curable silicone resin composition for sealing optical semiconductors of the present technology described above to the LED chip, heating the LED chip, and curing the heat-curable silicone resin composition for sealing optical semiconductors.

The composition used for the sealed optical semiconductor of the present technology is not particularly limited provided that it is the heat-curable silicone resin composition for sealing optical semiconductors of the present technology described above.

Because the heat-curable silicone resin composition for sealing optical semiconductors of the present technology described above is used as the composition for the sealed optical semiconductor of the present technology, the sealed optical semiconductor of the present technology has a hardness that is suitable for suppressing cracking, has superior gas barrier properties (e.g. sulfur resistance) and transparency, and has superior heat resistant coloration stability with respect to heat, light, and the like emitted from optical semiconductors such as LED chips and the like.

The LED chip used in the sealed optical semiconductor of the present technology is not particularly limited so long as it is an electric circuit having a light emitting diode as a light emitting device.

Color of the emitted light of the LED chip used in the sealed optical semiconductor of the present technology is not particularly limited. Examples thereof include white, blue, red, and green. Because of having superior heat resistant coloration stability even when under conditions of exposure to heat emitted from the LED chip for extended periods of time, the sealed optical semiconductor of the present technology can be applied to a white LED.

The white LED is not particularly limited. Examples thereof include conventionally known products.

A size and a shape of the LED chip are not particularly limited. Additionally, a type of the LED chip is not particularly limited, and examples thereof include high-power LEDs, high-brightness LEDs, and general use brightness LEDs.

The sealed optical semiconductor of the present technology has at least one or more of the LED chip in a single sealed optical semiconductor, and can have two or more of the LED chips.

Examples of a method for manufacturing the sealed optical semiconductor of the present technology include a method including: a step of applying the heat-curable silicone resin composition for sealing optical semiconductors of the present technology to the LED chip; and a step of sealing the LED chip by heating the LED chip to which the heat-curable silicone resin composition for sealing optical semiconductors has been applied, and curing the heat-curable silicone resin composition for sealing optical semiconductors.

In the step of applying, the heat-curable silicone resin composition for sealing optical semiconductors is applied to the LED chip. Thus, an LED chip on which the heat-curable silicone resin composition for sealing optical semiconductors is applied is obtained. The LED chip used in the step of applying is synonymous with the LED chip described above. The composition used in the step of applying is not particularly limited so long as it is the heat-curable silicone resin composition for sealing optical semiconductors of the present technology described above. The method for applying is not particularly limited.

Next, in the step of heating and curing, the LED chip is sealed by heating the LED chip to which the heat-curable silicone resin composition for sealing optical semiconductors is applied, and curing the heat-curable silicone resin composition for sealing optical semiconductors. Thus, the sealed optical semiconductor of the present technology can be obtained. The heating temperature used in the step of heating and curing is synonymous with that described above.

Examples of forms of the sealed optical semiconductor of the present technology include forms in which the cured product directly seals the LED chip, cannon ball forms, surface mounting forms, and forms wherein the cured product seals a portion between and/or a surface of a plurality of LED chips or sealed optical semiconductors.

Figure 2:
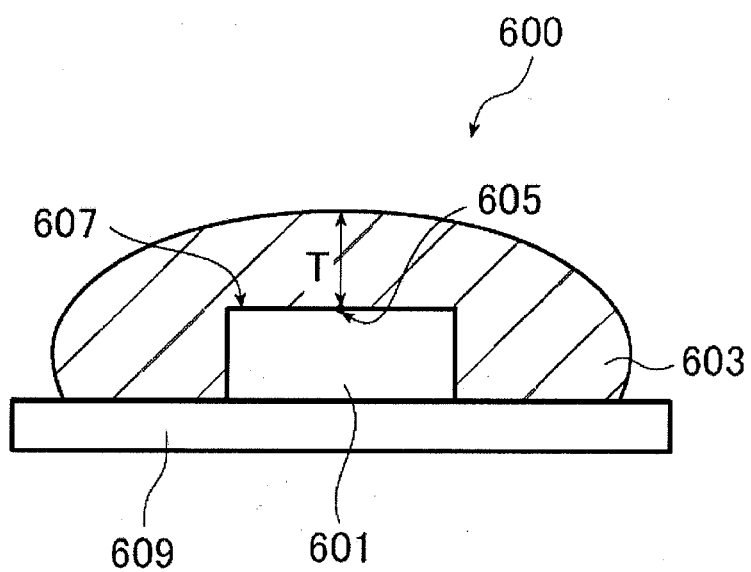
FIG. 2 is a cross-sectional view schematically illustrating a cross-section of the sealed optical semiconductor, taken along A-A depicted in FIG. 1.

A description of the sealed optical semiconductor of the present technology is given below while referencing the attached drawings. Note that the sealed optical semiconductor of the present technology is not limited to the attached drawings. FIG. 1 is a top view schematically illustrating an example of the sealed optical semiconductor of the present technology. FIG. 2 is a cross-sectional view schematically illustrating a cross-section of the sealed optical semiconductor, taken along A-A depicted in FIG. 1.

In FIG. 1, 600 is a sealed optical semiconductor of the present technology, and the sealed optical semiconductor 600 is provided with an LED chip 601, and a cured product 603 that seals the LED chip 601. The composition of the present technology described above becomes the cured product 603 after heating. Note that a substrate 609 is omitted in FIG. 1.

In FIG. 2, the LED chip 601 is bonded to the substrate 609 by, for example, an adhesive or solder (not illustrated), or is connected by means of a flip chip construction. Note that wires, bumps, electrodes, and the like are omitted in FIG. 2.

Additionally, T in FIG. 2 represents a thickness of the cured product 603. Specifically, T is a value arrived at when measuring the thickness of the cured product 603 from an arbitrary point 605 on a surface of the LED chip 601, in a direction perpendicular to a plane 607 on which the point 605 exists.

From the perspectives of ensuring transparency and obtaining superior hermeticity, the thickness of the cured product 603 (T in FIG. 2) of the sealed optical semiconductor of the present technology is preferably not less than 0.1 mm and more preferably from 0.5 to 1 mm.

Figure 3:
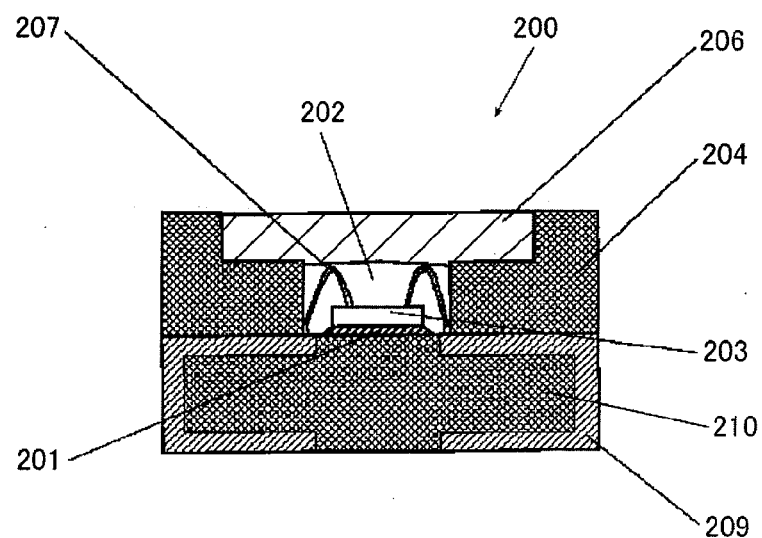
FIG. 3 is a cross-sectional view schematically illustrating an example of a sealed optical semiconductor of the present technology.
Figure 4:
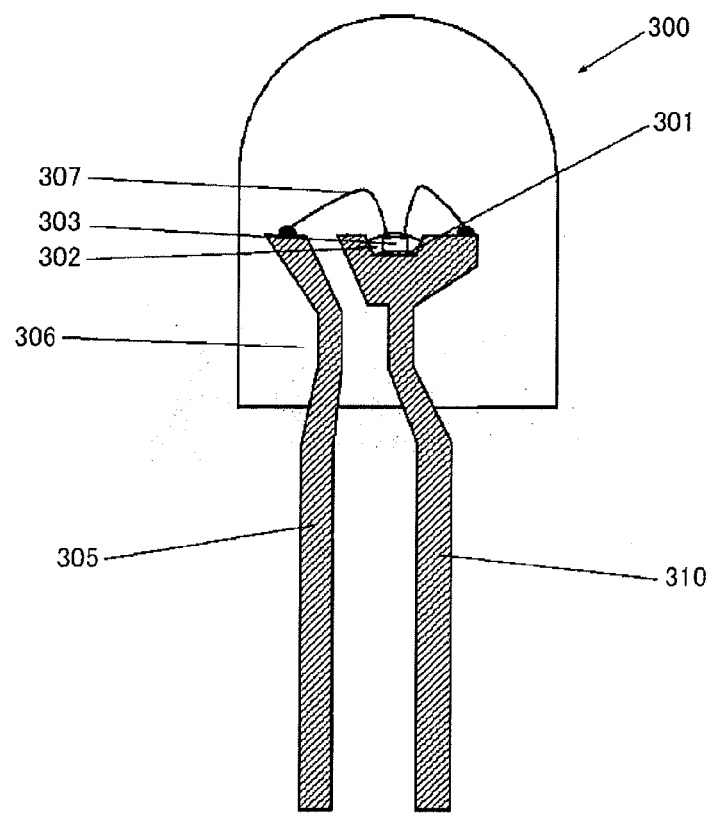
FIG. 4 is a cross-sectional view schematically illustrating an example of a sealed optical semiconductor of the present technology.

A description of an example of the sealed optical semiconductor of the present technology, wherein a white LED is used, is given below while referencing the attached drawings. FIG. 3 is a cross-sectional view schematically illustrating an example of a sealed optical semiconductor of the present technology. FIG. 4 is a cross-sectional view schematically illustrating an example of a sealed optical semiconductor of the present technology.

In FIG. 3, a sealed optical semiconductor 200 has a package 204 on a substrate 210.

A cavity 202 is provided in the package 204. A blue LED chip 203 and a cured product 202 are disposed in the cavity 202. The cured product 202 is formed by curing the composition of the present technology described above. In this case, the composition of the present technology can include a fluorescent substance that is usable for allowing the sealed optical semiconductor 200 to emit white light.

The blue LED chip 203 is fixed on the substrate 210 by a mount member 201. Each electrode of the blue LED chip 203 (not illustrated) and an external electrode 209 are wire bonded by a conductive wire 207.

The cavity 202 may be filled with the composition of the present technology described above up to a hatched portion 206.

Additionally, the cavity 202 can be filled with a different composition and the hatched portion 206 can be filled with the composition of the present technology described above.

In FIG. 4, a sealed optical semiconductor 300 of the present technology has a substrate 310, a blue LED chip 303, and an inner lead 305 in a resin 306 having lamp functionality.

A cavity (not illustrated) is provided in an upper portion of the substrate 310. The blue LED chip 303 and a cured product 302 are disposed in the cavity. The cured product 302 is formed by curing the composition of the present technology described above. In this case, the composition of the present technology described above can include a fluorescent substance or the like that is usable for allowing the sealed optical semiconductor 300 to emit white light. Additionally, the resin 306 can be formed using the composition of the present technology described above.

The blue LED chip 303 is fixed on the substrate 310 by a mount member 301.

Each electrode of the blue LED chip 303 (not illustrated) and the substrate 310 and the inner lead 305 are wire bonded by a conductive wire 307, respectively.

Note that in FIGS. 3 and 4, the LED chip was described as being a blue LED chip, however a red, green, and blue three color LED chip can be disposed in the cavity, or one or two colors selected from a red, green, and blue three color LED chip can be disposed in the cavity. Moreover, based on the color of the LED selected, a fluorescent substance that is usable for allowing the LED chip to emit white light can be added to the composition. The sealed optical semiconductor can be formed by filling the cavity with the composition of the present technology described above via, for example, a potting process and then heating.

Figure 5:
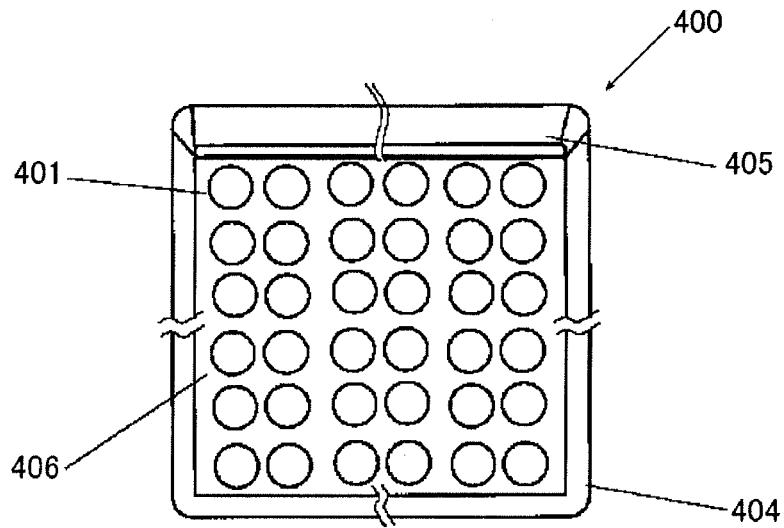
FIG. 5 is a drawing schematically illustrating an example of an LED display unit of the sealed optical semiconductor of the present technology.
Figure 6:
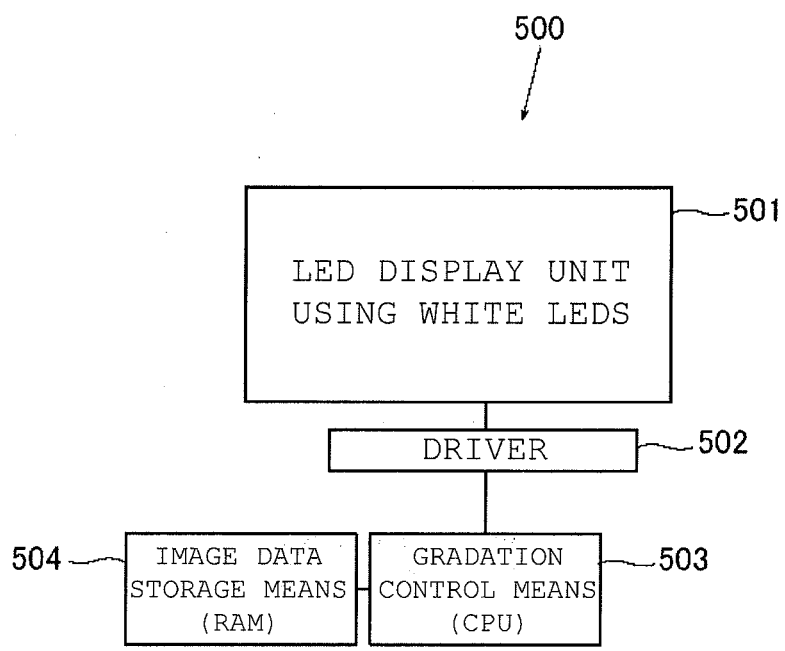
FIG. 6 is a block diagram of an LED display device used for the LED display unit depicted in FIG. 5.

A description of a case where the sealed optical semiconductor of the present technology is used in an LED display unit is given below while referencing the attached drawings. FIG. 5 is a drawing schematically illustrating an example of an LED display unit of the sealed optical semiconductor of the present technology. FIG. 6 is a block diagram of an LED display device used for the LED display unit depicted in FIG. 5. Note that the LED display unit and LED display device in which the sealed optical semiconductor of the present technology is used are not limited to the attached drawings.

In FIG. 5, an LED display unit 400 (the sealed optical semiconductor of the present technology) has a white LED chip 401 disposed matrix-like in a housing 404. The white LED chip 401 is sealed by a cured product 406, and a light blocking member 405 is disposed on a portion of the housing 404. The composition of the present technology described above can be used as the cured product 406. Additionally, the sealed optical semiconductor of the present technology can be used as the white LED chip 401.

In FIG. 6, an LED display device 500 is provided with an LED display unit 501 that uses white LEDs. The LED display unit 501 is in electrical connection with a lighting circuit (drive circuit) or the like. The LED display unit 501 can be configured so as to be a display or the like capable of displaying various images based on output pulses from the drive circuit. The drive circuit is provided with RAM (random access memory) 504 that temporarily stores display data to be input, a gradation control circuit (CPU) 503 that computes gradation signals from data stored in the RAM 504 for lighting each of the white LEDs to a predetermined brightness, and a driver 502 that is switched by output signals from the gradation control circuit (CPU) 503 and lights the white LEDs. The gradation control circuit (CPU) 503 computes a lighting time of the white LEDs from the data stored in the RAM 504 and outputs a pulse signal. Note that the sealed optical semiconductor of the present technology can be used in LED display units and LED display devices that can display color.

Examples of applications of the sealed optical semiconductor of the present technology include automobile lamps (headlamps, tail lamps, direction indicator lamps, and the like), household lighting fixtures, industrial lighting fixtures, stage lighting fixtures, displays, traffic lights, and projectors.

Examples

3. Working Examples

The present technology is described below in detail using Working Examples but the present technology is not limited to such Working Examples.

3.1. Manufacturing of the Component (B)

3.1.1. Manufacturing of the Zirconium Tributoxymononaftate (Organic Zirconium Compound 1)

11.4 g (0.026 mol) of zirconium tetrabutoxide having an 87.5 mass % concentration (manufactured by Kanto Chemical Co., Ltd.) and 6.6 g (0.026 mol) of naphthenic acid (manufactured by Tokyo Chemical Industry Co., Ltd.; average number of carbons of the hydrocarbon group bonded to the carboxy group: 15; neutralization value: 220 mg; same hereinafter) were introduced into a three-neck flask, and were stirred for about two hours at room temperature in a nitrogen atmosphere. Thus, the target composite was obtained.

Note that the neutralization value of the naphthenic acid is an amount of KOH necessary to neutralize 1 g of naphthenic acid.

Quantification of the composite was analyzed using a Fourier transform infrared spectrophotometer (FT-IR). As a result, it was confirmed that absorption at approximately 1,700 $cm^{-1}$ belonging to the COOH derived from carboxylic acid had ablated after the reaction, and a peak derived from COOZr of approximately 1,450 to 1,560-$cm^{-1}$ was confirmed.

The obtained composite (zirconium metal salt) is referred to as "organic zirconium compound 1". An average number of carbons of $R^2$ moiety in the naftate group ($R^2COO—$) included in the organic zirconium compound 1 is 15.

3.2. Evaluation

As described below, gas barrier properties (sulfur resistance), hardness, viscosity, liquid condition, and cracking resistance were evaluated. The results are shown in Table 1.

3.2.1. Gas Barrier Properties (Sulfur Resistance)

Cured sample fabrication: The silicone resin composition of each Working Example and Comparative Example was coated on silver plating so as to have a thickness of approximately 1 mm, and was cured by heating according to the conditions shown in Table 1. Thus, cured samples were fabricated.

Testing: Approximately 10 g (large excess with respect to 0.5 mmol of hydrochloric acid) of ferric sulfide crushed into a powder was placed at the bottom of a 10 L desiccator, a perforated plate (having through-holes) was attached within the desiccator above the ferric sulfide so as not to contact the ferric sulfide, and the cured sample was placed on the perforated plate. Next, 0.25 mmol of hydrogen sulfide (theoretical value of hydrogen sulfide concentration: 560 ppm; actual concentration: about 500 ppm) was produced by adding 0.5 mmol of hydrochloric acid dropwise to the largely excessive ferric sulfide (reaction formula: $FeS+2HCl \rightarrow FeCl_2+H_2S$). Discoloration of the silver was confirmed visually once per hour. In Table 1, samples for which discoloration was not visually confirmed are indicated by "O" and samples for which discoloration was visually confirmed are indicated by "X".

3.2.2. Hardness

Of the samples obtained as described below (initial cured products obtained by curing the heat-curable silicone resin composition for sealing optical semiconductors according to the conditions shown in Table 1), JIS A hardness of Comparative Example 1 of Table 1 was measured in accordance with the stipulations of JIS K6253:2006; and Shore D hardnesses of Working Examples 1 to 7 were measured using a Shore D-type spring hardness meter stipulated in ASTM-D 2240-68.

3.2.3. Viscosity

"Viscosity" refers to a value measured at 25° C. using a rotating viscometer.

3.2.4. Liquid Condition

After adding the raw materials and thoroughly mixing the composition, the composition was allowed to sit at rest for 24 hours. Then, the composition was visually confirmed as to the presence or absence of liquid separation.

3.2.5. Cracking Resistance

The composition, having a thickness of not less than 1 mm, was cured on a glass plate according to the curing conditions shown in Table 1, and then was allowed to sit at rest for 24 hours after cooling to room temperature. Then, the presence or absence of cracking was confirmed.

3.3. Fabrication of Samples (Used in the Evaluation of Hardness)

A description of the fabrication of the samples is given below while referencing the attached drawings.

Figure 7:
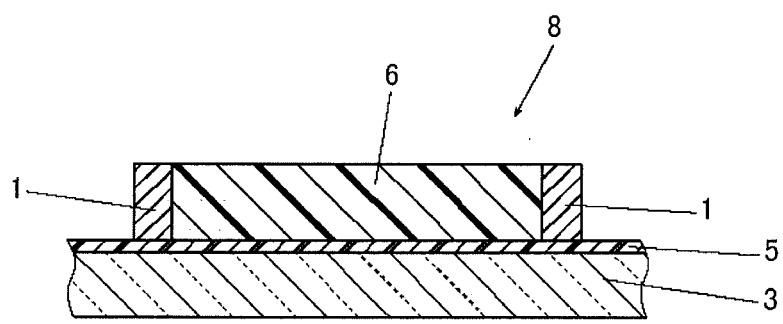
FIG. 7 is a cross-sectional view schematically illustrating a cross-section of a die used for curing compositions of the present technology in the Working Examples.

FIG. 7 is a cross-sectional view schematically illustrating a cross-section of a die used for curing the heat-curable silicone resin composition for sealing optical semiconductors of the present technology in the Working Examples.

In FIG. 7, a die 8 is provided with a PET film 5 on a glass 3 (size of the glass 3=10 cm (length)×10 cm (width)×4 mm (thickness)). A silicone mold spacer 1 (5 cm (length)×5 cm (width)×2 mm (height)) is provided on the PET film 5.

Using the die 8, a composition 6 is poured into an interior portion 6 of the spacer 1, and a sample was cured as follows.

The die 8 filled with the composition 6 was put into an electric oven and heated under the curing conditions shown in Table 1 to cure the composition 6. Thus, a cured product 6 (initially cured product) having a thickness of 2 mm was produced. The obtained cured product 6 was used as a sample for evaluating hardness.

3.4. Production of the Heat-Curable Silicone Resin Composition for Sealing Optical Semiconductors The heat-curable silicone resin composition for sealing optical semiconductors was produced by uniformly mixing the constituents shown in Table 1 at the amounts (unit: parts by mass) shown in the Table 1 using a vacuum stirrer.

The compositions of Working Examples 1 and 2 in Table 1 include the component (A) and the component (B). On the other hand, the composition of Comparative Example 1 in Table 1 does not include the component (A). Comparative Example 1 is an example where an addition curing silicone resin is used.

TABLE 1

|  | Working Example 1 | Working Example 2 | Working Example 3 | Working Example 4 | Working Example 5 | Working Example 6 | Working Example 7 | Working Example 8 | Comparative Example 1 |
|---|---|---|---|---|---|---|---|---|---|
| (A) Silicon compound A1-1 | 60 | — | 60 | 60 | 60 | 60 | 60 | 60 | — |
| (A) Silicon compound A1-2 | — | 50 | — | — | — | — | — | — | — |
| (A) Silicon compound A2-1 | 20 | 50 | — | 20 | 40 | — | 20 | 20 | — |
| (A) Silicon compound A2-2 | 20 | — | — | — | — | — | — | 20 | — |
| (B) Condensation catalyst 1 | 0.025 | 0.025 | 0.025 | 0.025 | 0.025 | 0.025 | 0.025 | 0.025 | — |
| (B) Condensation catalyst 2 | 0.025 | 0.025 | 0.025 | 0.025 | 0.025 | 0.025 | 0.025 | — | — |
| (B) Condensation catalyst 3 | — | — | — | — | — | — | — | 0.3 | — |
| (C) Component 1 | — | — | 40 | 20 | — | — | — | — | — |
| (C) Component 2 | — | — | — | — | — | 40 | 20 | — | — |
| Addition curing silicone resin | — | — | — | — | — | — | — | — | 100 |
| Composition (liquid) condition | Uniform | Uniform | Uniform | Uniform | Uniform | Uniform | Uniform | Uniform | Uniform |
| Curing conditions | 150° C./24 hours | 150° C./24 hours | 150° C./24 hours | 150° C./24 hours | 150° C./24 hours | 150° C./24 hours | 150° C./24 hours | 150° C./24 hours | 100° C./30 minutes |

TABLE 1-continued

| | Working Example 1 | Working Example 2 | Working Example 3 | Working Example 4 | Working Example 5 | Working Example 6 | Working Example 7 | Working Example 8 | Comparative Example 1 |
|---|---|---|---|---|---|---|---|---|---|
| Viscosity (mPa·s) | 180,000 | 150,000 | 8,000 | 18,000 | 300,000 | 12,000 | 20,000 | 180,000 | 3,000 |
| Sulfur resistance | ○ | ○ | ○ | ○ | ○ | ○ | ○ | ○ | X |
| Cracking resistance | X | X | ○ | ○ | X | ○ | ○ | X | ○ |
| Hardness | D71 | D78 | D43 | D31 | D63 | D55 | D47 | D65 | A56 |

The components shown in Table 1 are as follows.

(A) Silicon compound A1-1: Silicone resin including silsesquioxane (weight-average molecular weight: 9,400, trade designation: SILRES MK, manufactured by Wacker), melting point: 45° C.

(A) Silicon compound A1-2: Silicone resin including silsesquioxane (weight-average molecular weight: 2,500, trade designation: KR-242A, manufactured by Shin-Etsu Chemical Co., Ltd.), melting point: 70° C.

(A) Silicon compound A2-1: Silicone alkoxy oligomer (corresponds to the silicon compound expressed by Formula (1) above, and is the silicon compound expressed by Formula (2) above; in Formula (2), "m" is $1 \le m < 2$, "n" is $0 < n < 1.5$, and m+n is $1 < m+n \le 3$; $R^4$ is a methyl group and $R^5$ is a methyl group; weight-average molecular weight: 6,000, trade designation: x-40-9246, manufactured by Shin-Etsu Chemical Co., Ltd.), amount of hydrolyzable groups in one molecule: 12 mass %, liquid at room temperature.

(A) Silicon compound A2-2: Silicone alkoxy oligomer (corresponds to the silicon compound expressed by Formula (1) above, and is the silicon compound expressed by Formula (2) above; in Formula (2), "m" is $1 \le m < 2$, "n" is $0 < n < 1.5$, and m+n is $1 < m+n \le 3$; $R^4$ is a methyl group and $R^5$ is a methyl group; weight-average molecular weight: 3,400, trade designation: x-40-9225, manufactured by Shin-Etsu Chemical Co., Ltd.), amount of hydrolyzable groups in one molecule: 24 mass %, liquid at room temperature.

(B) Condensation catalyst 1: The organic zirconium compound 1 manufactured as described above.

(B) Condensation catalyst 2: Dibutyltin diacetate, manufactured by Nitto Kasei Co., Ltd.

(B) Condensation catalyst 3: (2-ethylhexanoic acid)zinc (manufactured by Hope Chemical Co., Ltd.)

Component (C) 1: Polydimethylsiloxane capped at both ends with dimethyl methoxysiloxy groups (in Formula (4), both of the two $R^6$ moieties are methyl groups and "X" is a compound that is a methyl group; weight-average molecular weight: 1,000, trade designation: XC96-C2813, manufactured by Momentive Performance Materials Inc.)

Component (C) 2: Polymethylcyclohexylsiloxane capped at both ends with hydroxyl groups (in Formula (3), $R^6$ is a methyl group and $R^7$ is a compound that is a cyclohexyl group; weight-average molecular weight: 1,000, synthesized according to the method described below)

Synthesis method of component (C) 2: 18.8 g (0.1 moles) of cyclohexyl methyldimethoxysilane and 0.09 g (0.12 mmol) of a 15% aqueous solution of tetramethyl ammonium hydroxide were placed in a 200 ml three-neck flask provided with a magnetic stirrer and a reflux condenser and 9 g (0.5 moles) of water was added dropwise thereto at room temperature over a period of 30 minutes. After the water was added, the solution was heated at 80° C. for one hour and then further heated to 150° C. over a period of one hour. After heating at 150° C. for three hours, low-boiling substances were distilled off for three hours at 1.3 kPa. Thus, 11.0 g of a light yellow transparent liquid (the component (C) 2) was obtained.

Addition curing silicone resin (trade designation: KE-106, manufactured by Shin-Etsu Chemical Co., Ltd.)

3.5. Results

It is clear from the results shown in Table 1 that sulfur resistance of the cured product obtained using the composition of Comparative Example 1, which did not include the component (A), was inferior.

In contrast, the cured products obtained using the compositions of Working Examples 1 to 8 had superior sulfur resistance. Additionally, Working Examples 1 to 8 had suitable viscosities and hardnesses. Furthermore, Working Examples 3, 4, 6, and 7, which included the component (C), had superior cracking resistance.

What is claimed is:

1. A heat-curable silicone resin composition for sealing optical semiconductors comprising:

Component (A): 100 parts by mass of a silicon compound expressed by Formula (1) below $(R^1SiO_{3/2})_a((R^2)_2SiO_{2/2})_b((R^3)_3SiO_{1/2})_c(SiO_{4/2})_d(XO_{1/2})_e \ldots (1)$
wherein $R^1$, $R^2$, and $R^3$ are identical or differing monovalent organic groups, "X" is a hydrogen atom or a monovalent organic group, "a" is a positive number, "b" is 0 or a positive number, "c" is 0 or a positive number, "d" is 0 or a positive number, and "e" is 0 or a positive number; however "a" to "e" satisfy the following conditions: b/a is a number from 0 to 10, c/a is a number from 0 to 0.5, d/(a+b+c+d) is a number from 0 to 0.3, and, when e is a positive number, e/(a+b+c+d) is a number from 0.01 to 1.5, wherein the component (A) is a silicon compound A1 having a melting point or softening point that is greater than 25° C. or the component (A) comprises both a silicon compound A1 having a melting point or softening point that is greater than 25° C. and a silicon compound A2 having a melting point or softening point that is not greater than 25° C., wherein the silicon compound A1 has a silsesquioxane skeleton; and Component (B): from 0.001 to 10 parts by mass of a condensation catalyst, wherein the component (B) includes both a transition metal compound and a base metal compound, and wherein the composition includes from 0.001 to 0.5 parts by mass of the transition metal compound per 100 parts by mass of the component (A) and 0.1 to 10 parts by mass of the base metal compound per 1 part by mass of the transition metal compound.

2. The heat-curable silicone resin composition for sealing optical semiconductors according to claim 1, wherein the silicon compound A2 is at least one selected from the group consisting of:

a partially hydrolytic condensate of a hydrolytic condensable silane compound expressed by Formula (2) below, having not more than 30 mass % of hydrolyzable groups;
a silicone alkoxy oligomer; and
a compound having an alkoxysilyl group on at least one end and not less than three alkoxy groups in the molecule;

$$(R^4)_m(OR^5)_nSiO_{(4-m-n)/2} \quad (2)$$

wherein $R^4$ are identical or differing alkyl groups, alkenyl groups, or aryl groups having from 1 to 6 carbons; $R^5$ are identical or differing hydrogen atoms, or alkyl groups, alkenyl groups, alkoxyalkyl groups, or acyl groups having from 1 to 6 carbons; "m" is a number satisfying $0.5 \le m < 2.0$; and "n" is a number satisfying $0 < n < 2$; however, $1 < m+n \le 3$.

3. The heat-curable silicone resin composition for sealing optical semiconductors according to claim 1, wherein the silicon compound A2 is a partially hydrolytic condensate of a methyltrimethoxysilane or a partially hydrolytic condensate of a mixture of a methyltrimethoxysilane and a dimethyldimethoxysilane.

4. The heat-curable silicone resin composition for sealing optical semiconductors according to claim 1, comprising one type or two or more types of the component (B); wherein
at least one type of the component (B) is a zirconium compound and/or a zinc compound.

5. The heat-curable silicone resin composition for sealing optical semiconductors according to claim 1, comprising two or more types of the component (B); wherein
the component (B) includes both a transition metal compound and a base metal compound.

6. The heat-curable silicone resin composition for sealing optical semiconductors according to claim 1, further comprising from 1 to 1,000 parts by mass of a component (C), which is a compound expressed by Formula (3) below, having a molecular weight not greater than 50,000 and/or a compound expressed by Formula (4) below, having a molecular weight not greater than 5,000, per 100 parts by mass of the component (A);

$$HO(R^6_2SiO)_m(R^6R^7SiO)_nH \quad (3)$$

wherein $R^6$ is a monovalent hydrocarbon group having from 1 to 20 carbons, $R^7$ is a monovalent hydrocarbon group having from 2 to 20 carbons that is different from $R^6$, "m" is an integer greater than or equal to 0, and "n" is an integer greater than or equal to 3;

$$XO((R^6)_2SiO)_nX \quad (4)$$

wherein $R^6$ are identical or differing groups defined in Formula (3) above, "n" is an integer greater than or equal to 3, and "X" is a hydrogen atom or a monovalent hydrocarbon group having from 1 to 6 carbons.

7. The heat-curable silicone resin composition for sealing optical semiconductors according to claim 6, wherein in the Formula (3), a group represented by $R^7$ is a monovalent hydrocarbon group having a ring structure.

8. The heat-curable silicone resin composition for sealing optical semiconductors according to claim 1, wherein the composition includes both the silicon compound A1 and the silicon compound A2, and the composition includes 500 parts or less by mass of the silicon compound A2 per 100 parts by mass of the silicon compound A1.

9. The heat-curable silicone resin composition for sealing optical semiconductors according to claim 1, wherein a melting point or softening point of the silicon compound A1 is from 50 to 80° C.

10. The heat-curable silicone resin composition for sealing optical semiconductors according to claim 1, wherein a weight-average molecular weight of the silicon compound A1 is from 500 to 10,000.

11. The heat-curable silicone resin composition for sealing optical semiconductors according to claim 1, wherein a weight-average molecular weight of the silicon compound A2 is from 500 to 10,000.

12. The heat-curable silicone resin composition for sealing optical semiconductors according to claim 1, wherein the component (B) comprises a zirconium compound and a zinc compound, an amount of the zinc compound with respect to the zirconium compound being from 0.1 to 10 parts by mass of the zinc compound.

13. A sealed optical semiconductor obtained by sealing an LED chip by:
applying a heat-curable silicone resin composition for sealing optical semiconductors described in claim 1 to the LED chip, heating the LED chip, and curing the heat-curable silicone resin composition for sealing optical semiconductors.

14. The heat-curable silicone resin composition for sealing optical semiconductors according to claim 13, wherein curing the heat-curable silicone resin composition is performed under substantially anhydrous conditions at a heating temperature of from 100° C. to 200° C.

15. The heat-curable silicone resin composition for sealing optical semiconductors according to claim 13, wherein transmission, measured at a wavelength of 400 nm, of a product of curing the heat-curable silicone resin composition is not less than 80%.

16. The heat-curable silicone resin composition for sealing optical semiconductors according to claim 13, wherein a retention rate of transmittance of a product of curing the heat-curable silicone resin composition is from 70 to 100%.

17. The sealed optical semiconductor according to claim 13, wherein a thickness of a product of curing the heat-curable silicone resin composition is from 0.5 to 1 mm.

18. A heat-curable silicone resin composition for sealing optical semiconductors comprising:
Component (A): 100 parts by mass of a silicon compound expressed by Formula (1) below $(R^1SiO_{3/2})_a((R^2)_2SiO_{2/2})_b((R^3)_3SiO_{1/2})_c(SiO_{4/2})_d(XO_{1/2})_e \ldots (1)$
wherein $R^1$, $R^2$, and $R^3$ are identical or differing monovalent organic groups, "X" is a hydrogen atom or a monovalent organic group, "a" is a positive number, "b" is 0 or a positive number, "c" is 0 or a positive number, "d" is 0 or a positive number, and "e" is 0 or a positive number; however "a" to "e" satisfy the following conditions: b/a is a number from 0 to 10, c/a is a number from 0 to 0.5, d/(a+b+c+d) is a number from 0 to 0.3, and, when e is a positive number, e/(a+b+c+d) is a number from 0.01 to 1.5,
wherein the component (A) is a silicon compound A1 having a melting point or softening point that is greater than 25° C. or the component (A) comprises both a silicon compound A1 having a melting point or softening point that is greater than 25° C. and a silicon compound A2 having a melting point or softening point that is not greater than 25° C., and
wherein the silicon compound A1 has a silsesquioxane skeleton;
Component (B): from 0.001 to 10 parts by mass of a condensation catalyst, wherein the component (B) includes both a transition metal compound and a base metal compound, and wherein the composition includes from 0.001 to 0.5 parts by mass of the transition metal compound per 100 parts by mass of the component (A) and 0.1 to 10 parts by mass of the base metal compound per 1 part by mass of the transition metal compound; and from 1 to 1000 parts by mass of component (C), which is a compound expressed by Formula (3) below, having a molecular weight not greater than 50,000 and/or a compound expressed by Formula (4) below, having a molecular weight not greater than 5,000, per 100 parts by mass of the component (A);

$$HO(R^6_2SiO)_m(R^6R^7SiO)_nH \quad (3)$$

wherein $R^6$ is a monovalent hydrocarbon group having from 1 to 20 carbons, $R^7$ is a monovalent hydrocarbon group having from 2 to 20 carbons that is different from $R^6$, "m" is an integer greater than or equal to 0, and "n" is an integer greater than or equal to 3;

$$XO((R^6)_2SiO)_nX \quad (4)$$

wherein $R^6$ are identical or differing groups defined in Formula (3) above, "n" is an integer greater than or equal to 3, and "X" is a hydrogen atom or a monovalent hydrocarbon group having from 1 to 6 carbons.

* * * * *